US011393703B2

(12) United States Patent
Lerner et al.

(10) Patent No.: US 11,393,703 B2
(45) Date of Patent: Jul. 19, 2022

(54) APPARATUS AND METHOD FOR CONTROLLING A FLOW PROCESS MATERIAL TO A DEPOSITION CHAMBER

(71) Applicant: APPLIED MATERIALS, INC., Santa Clara, CA (US)

(72) Inventors: Alexander Lerner, San Jose, CA (US); Roey Shaviv, Palo Alto, CA (US); Phillip Stout, Santa Clara, CA (US); Joseph M Ranish, San Jose, CA (US); Prashanth Kothnur, San Jose, CA (US); Satish Radhakrishnan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 169 days.

(21) Appl. No.: 16/442,527

(22) Filed: Jun. 16, 2019

(65) Prior Publication Data

US 2019/0382890 A1 Dec. 19, 2019

Related U.S. Application Data

(60) Provisional application No. 62/686,492, filed on Jun. 18, 2018.

(51) Int. Cl.
*H01L 21/67* (2006.01)
*C23C 16/455* (2006.01)
(Continued)

(52) U.S. Cl.
CPC .... *H01L 21/67098* (2013.01); *C23C 16/4412* (2013.01); *C23C 16/4485* (2013.01);
(Continued)

(58) Field of Classification Search
CPC ......... H01L 21/67098; H01L 21/67017; H01L 21/67115; H01L 21/67253;
(Continued)

(56) References Cited

U.S. PATENT DOCUMENTS

| 3,573,888 A | * | 4/1971 | Bogart | ................... C03C 21/007 |
| | | | | 65/30.14 |
| 4,717,596 A | * | 1/1988 | Barbee | ................ C23C 16/4485 |
| | | | | 118/50 |

(Continued)

FOREIGN PATENT DOCUMENTS

| JP | 61205629 A | * | 9/1986 | ......... C23C 16/4485 |
| JP | 01067243 A | * | 3/1989 | ........... B01D 1/0082 |
| WO | WO 2010/030649 | | 3/2010 | |

OTHER PUBLICATIONS

International Search Report and Written Opinion for PCT/US2019/037527, dated Oct. 23, 2019.

*Primary Examiner* — Jeffrie R Lund
(74) *Attorney, Agent, or Firm* — Moser Taboada

(57) ABSTRACT

Methods and apparatus for controlling a flow of process material to a deposition chamber. In embodiments, the apparatus includes a deposition chamber in fluid communication with one or more sublimators through one or more delivery lines, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening, wherein the one or more delivery lines include one or more conduits between the deposition chamber and the one or more sublimators, and wherein the one or more conduits include one or more valves to open or close the one or more conduits, wherein the one or more valves in an open position prevents the flow of (Continued)

process material into the deposition chamber, and wherein the one or more valves in a closed position directs the flow of process material into the deposition chamber.

14 Claims, 6 Drawing Sheets

(51) Int. Cl.
  *C23C 16/448* (2006.01)
  *C23C 16/44* (2006.01)
(52) U.S. Cl.
  CPC .... *C23C 16/4557* (2013.01); *C23C 16/45561* (2013.01); *C23C 16/45563* (2013.01); *C23C 16/45565* (2013.01); *H01L 21/67017* (2013.01)
(58) Field of Classification Search
  CPC ......... H01L 21/67248; H01L 21/67276; H01L 51/0002; H01L 21/02271; H01L 21/02205; H01L 27/146; C23C 16/4485; C23C 16/45563; C23C 16/4412; C23C 16/303; C23C 16/45565; C23C 16/4557; C23C 16/45574; C23C 16/45561; C23C 16/4401; C23C 16/44
  USPC .................................................. 118/726, 715
  See application file for complete search history.

(56) References Cited

U.S. PATENT DOCUMENTS

| | | | | |
|---|---|---|---|---|
| 4,947,789 | A * | 8/1990 | Hussla | C23C 16/4485 118/715 |
| 5,224,202 | A * | 6/1993 | Arnold | C23C 16/4483 392/389 |
| 5,365,772 | A * | 11/1994 | Ueda | G01M 3/226 73/40.7 |
| 5,443,648 | A * | 8/1995 | Ohkase | H01L 21/67115 118/724 |
| 5,451,258 | A * | 9/1995 | Hillman | C23C 16/4485 118/715 |
| 5,496,408 | A * | 3/1996 | Motoda | C23C 16/4481 118/715 |
| 5,575,853 | A * | 11/1996 | Arami | C23C 16/4412 118/712 |
| 5,777,300 | A * | 7/1998 | Homma | H01L 21/67115 219/679 |
| 5,851,293 | A * | 12/1998 | Lane | C23C 16/4412 118/715 |
| 5,888,579 | A * | 3/1999 | Lun | C23C 16/345 427/8 |
| 5,989,345 | A * | 11/1999 | Hatano | C23C 16/4485 118/715 |
| 6,113,698 | A * | 9/2000 | Raaijmakers | H01L 21/67103 118/715 |
| 6,139,642 | A * | 10/2000 | Shimahara | C23C 16/4408 118/724 |
| 6,176,930 | B1 | 1/2001 | Koai et al. | |
| 6,482,266 | B1 * | 11/2002 | Matsumoto | C23C 16/4485 118/715 |
| 6,524,650 | B1 * | 2/2003 | Shimahara | C23C 16/4408 427/248.1 |
| 6,596,641 | B2 * | 7/2003 | Jost | H01L 21/76802 438/704 |
| 6,635,965 | B1 | 10/2003 | Lee et al. | |
| 8,056,500 | B2 | 11/2011 | Tseng et al. | |
| 8,057,601 | B2 | 11/2011 | Koelmel et al. | |
| 8,111,978 | B2 | 2/2012 | Sorabji et al. | |
| 8,888,916 | B2 | 11/2014 | Tseng et al. | |
| 10,428,807 | B2 * | 10/2019 | Gregor | F04B 49/06 |
| 2001/0044213 | A1 * | 11/2001 | Pandhumsoporn | H01L 21/30655 438/719 |
| 2002/0017246 | A1 * | 2/2002 | Kojima | C23C 16/4485 118/726 |
| 2003/0094136 | A1 * | 5/2003 | Bartholomew | C23C 16/4412 118/715 |
| 2004/0238519 | A1 * | 12/2004 | Sakamoto | H01L 21/67109 219/390 |
| 2005/0000425 | A1 * | 1/2005 | Fairbourn | C23C 16/029 118/715 |
| 2007/0036700 | A1 * | 2/2007 | Redden | C01B 19/007 423/99 |
| 2007/0068625 | A1 * | 3/2007 | Funk | C23C 16/45565 156/345.33 |
| 2007/0151518 | A1 * | 7/2007 | Kato | C23C 16/4481 118/726 |
| 2008/0203084 | A1 * | 8/2008 | Yamaga | H01L 21/67248 219/441 |
| 2008/0213716 | A1 * | 9/2008 | Koyama | H01L 21/67248 432/120 |
| 2008/0255683 | A1 * | 10/2008 | Takahashi | H01L 21/67248 219/494 |
| 2008/0274627 | A1 | 11/2008 | Hamada et al. | |
| 2009/0078197 | A1 * | 3/2009 | Takenaga | H01L 21/67276 700/121 |
| 2009/0117259 | A1 * | 5/2009 | Kataoka | H01L 21/67253 427/9 |
| 2009/0250006 | A1 * | 10/2009 | Yamasaki | C23C 16/4481 118/726 |
| 2009/0263578 | A1 * | 10/2009 | Lindfors | C23C 16/45544 427/248.1 |
| 2009/0311807 | A1 * | 12/2009 | Yamaga | H01L 21/67109 257/E21.482 |
| 2010/0305884 | A1 | 12/2010 | Yudovsky et al. | |
| 2011/0143091 | A1 * | 6/2011 | Liu | C30B 29/08 428/141 |
| 2013/0037534 | A1 * | 2/2013 | Yoshii | H01L 21/67781 219/494 |
| 2013/0340678 | A1 * | 12/2013 | Wamura | C23C 16/45525 118/712 |
| 2015/0300227 | A1 * | 10/2015 | Hayashi | B01D 45/08 55/342.2 |
| 2015/0329962 | A1 * | 11/2015 | Sancho Martinez | C23C 16/4485 427/255.28 |
| 2016/0004259 | A1 * | 1/2016 | Salinas | F24F 6/025 137/561 A |
| 2016/0035600 | A1 * | 2/2016 | Rivera | B01D 53/02 96/111 |
| 2017/0096735 | A1 | 4/2017 | Kumar et al. | |
| 2018/0163307 | A1 | 6/2018 | Carlson | |
| 2018/0204720 | A1 * | 7/2018 | Tanaka | H01J 37/32449 |
| 2018/0265983 | A1 * | 9/2018 | Qian | C23C 16/4485 |
| 2019/0382890 | A1 * | 12/2019 | Lerner | C23C 16/4401 |
| 2020/0048767 | A1 * | 2/2020 | Kothnur | C23C 16/4557 |
| 2020/0087790 | A1 * | 3/2020 | Lerner | C23C 16/45525 |
| 2020/0385851 | A1 * | 12/2020 | Lerner | C23C 14/243 |

\* cited by examiner

600

┌─────────────────────────────────────────────┐
│ SUBLIMATING ONE OR MORE PRECURSOR           │
│ MATERIALS IN ONE OR MORE SUBLIMATORS TO     │
│ FORM ONE OR MORE VAPOR PRECURSORS,          │
│ WHEREIN THE ONE OR MORE SUBLIMATORS         │
│ EACH COMPRISE AN AMPOULE IN FLUID           │
│ COMMUNICATION WITH ONE OR MORE DELIVERY     │──602
│ LINES THROUGH AN OPENING, AND AT LEAST A    │
│ FIRST HEAT SOURCE AND A SECOND HEAT         │
│ SOURCE, WHEREIN THE FIRST HEAT SOURCE IS    │
│ A RADIANT HEAT SOURCE ADJACENT THE          │
│ AMPOULE AND A SECOND HEAT SOURCE IS         │
│ ADJACENT THE OPENING                        │
└─────────────────────────────────────────────┘
                      ↓
┌─────────────────────────────────────────────┐
│ FLOWING THE ONE OR MORE VAPOR               │
│ PRECURSORS THROUGH ONE OR MORE              │
│ DELIVERY LINES IN FLUID COMMUNICATION WITH  │
│ A DEPOSITION CHAMBER; WHEREIN THE ONE OR    │──604
│ MORE DELIVERY LINES ARE CONNECTED TO ONE    │
│ OR MORE CONDUITS AT A JUNCTION BETWEEN      │
│ THE DEPOSITION CHAMBER AND ONE OR MORE      │
│ SUBLIMATORS                                 │
└─────────────────────────────────────────────┘
                      ↓
┌─────────────────────────────────────────────┐
│ SETTING ONE OR MORE VALVES IN THE ONE OR    │
│ MORE CONDUITS TO CONTROL A FLOW OF          │──606
│ PRECURSOR MATERIAL FROM THE ONE OR MORE     │
│ SUBLIMATORS TO THE DEPOSITION CHAMBER       │
└─────────────────────────────────────────────┘

FIG. 6

APPARATUS AND METHOD FOR CONTROLLING A FLOW PROCESS MATERIAL TO A DEPOSITION CHAMBER

CROSS-REFERENCE TO RELATED APPLICATION

This application claims benefit of U.S. provisional patent application Ser. No. 62/686,492 filed on Jun. 18, 2018, entirely incorporated herein by reference.

FIELD

Embodiments of the present disclosure generally relate to semiconductor processing equipment. The disclosure is more particularly directed toward systems, apparatus, and methods for supplying vaporized reactants to a reaction chamber, for example, in semiconductor device manufacturing equipment.

BACKGROUND

Organic vapor deposition is becoming increasingly relevant in building semiconductor devices such as CMOS Image Sensors (CIS) and other optical devices. However, the inventors have observed that depositing organic material on a workpiece in a deposition process is problematic due to purity and/or contamination concerns that, among other things, prevent the use of a carrier gas.

Further, the inventors have observed that maintaining process conditions during organic vapor deposition is difficult and may be problematic for a number of reasons. For example, an increase in the frequency of wafer throughput and replacement complicates the system. Further, precursor shut-off may be problematic due to residual precursor in the lines system which may condense. Residual precursor vapor may also be continuously drawn into the chamber resulting in an over-flood of precursor. Consequently, the interior of the process chamber and other parts of the apparatus and wafer may become undesirably coated lowering consumption efficiency of the precursor. The coating may subsequently flake off into large particles which can contaminate the wafer and other parts of the apparatus. Moreover, thermal control of the precursor source may be problematic and contribute to wasted vapor in a delivery line.

Therefore, the inventors have provided an improved precursor delivery system, apparatus, and method for controlling the flow of process material into a deposition system such as organic vapor deposition system to reduce the likelihood of plating or particle formation within the system as well as increase deposition rate, consumption efficiency, and uniform delivery of precursor material.

SUMMARY

Methods and apparatus for controlling a flow of process material are provided herein. In some embodiments, an apparatus for controlling a flow of process material to a deposition chamber, includes: a deposition chamber in fluid communication with one or more sublimators through one or more delivery lines, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening, wherein the one or more delivery lines include one or more conduits between the deposition chamber and the one or more sublimators, and wherein the one or more conduits includes one or more valves to open or close the one or more conduits, wherein the one or more valves in an open position prevents the flow of process material into the deposition chamber when process material is present in the one or more delivery lines, and wherein the one or more valves in a closed position directs the flow of process material into the deposition chamber when process material is present in the one or more delivery lines.

In some embodiments, a method for controlling a flow of process material to a deposition chamber, includes: sublimating one or more precursor materials in one or more sublimators to form one or more vapor precursors, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening; flowing the one or more vapor precursors through one or more delivery lines in fluid communication with a deposition chamber; wherein the one or more delivery lines are connected to one or more conduits at a junction between the deposition chamber and one or more sublimators; and setting one or more valves in the one or more conduits to control a flow of precursor material from the one or more sublimators to the deposition chamber.

In some embodiments a non-transitory computer readable medium having instructions stored thereon that, when executed, cause a method for controlling a flow of process material to a deposition chamber, includes: sublimating one or more precursor materials in one or more sublimators to form one or more vapor precursors, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening; flowing the one or more vapor precursors through one or more delivery lines in fluid communication with a deposition chamber; wherein the one or more delivery lines are connected to one or more conduits at a junction between the deposition chamber and one or more sublimators; and setting one or more valves in the one or more conduits to control a flow of precursor material from the one or more sublimators to the deposition chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 6 illustrates a method for controlling a flow of process material to a deposition chamber in accordance with the present disclosure.

Figure 1:
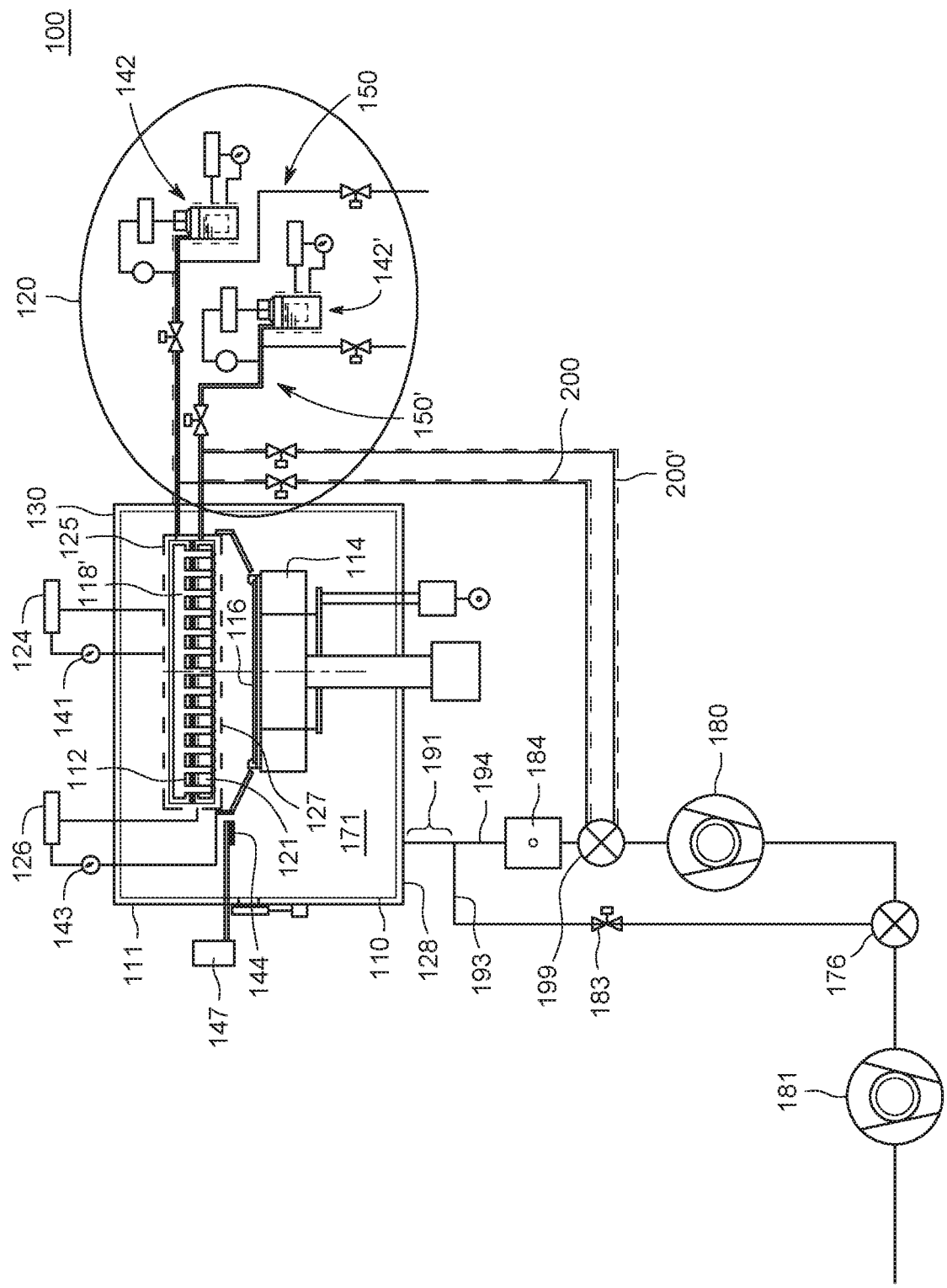
FIG. 1 illustrates a schematic side view of a deposition system of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Apparatus and methods for processing a substrate and/or controlling a flow of process material to a deposition chamber are provided herein. In embodiments, the present disclosure relates to an apparatus for controlling a flow of process material to a deposition chamber, including: a deposition chamber in fluid communication with one or more sublimators through one or more delivery lines, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening, wherein the one or more delivery lines include one or more conduits between the deposition chamber and the one or more sublimators, and wherein the one or more conduits includes one or more valves to open or close the one or more conduits, wherein the one or more valves in an open position prevents the flow of process material into the deposition chamber when process material is present in the one or more delivery lines, and wherein the one or more valves in a closed position directs the flow of process material into the deposition chamber when process material is present in the one or more delivery lines. In embodiments, the delivery lines form a flow path between the deposition chamber and the one or more sublimators, and the one or more conduits connect to the one or more delivery lines at a junction between the process chamber and one or more sublimators.

The inventors have observed that heated precursor delivery systems require one or more upstream conduits to direct one or more process materials such as precursors away from the process chamber to avoid any condensation problems inside the process chamber. Further, the inventors have found that the apparatus and methods of the present disclosure are advantageous by providing efficient delivery of a process material such as a precursor material to a deposition system in a controlled fashion without compromising or unduly adding to the complexity of the system. Further, the inventors have found the apparatus and methods of the present disclosure are advantageous in providing uniform delivery, improved consumption efficiency of a precursor material, and efficient throughput of a wafer processing system. Moreover, the apparatus of the present disclosure improves heating of process material such as precursor material to improve the flow of the process material in the apparatus. Further, the apparatus of the present disclosure may include a showerhead and/or delivery system configured to prevent thermal cross-talk between two or more adjacent process materials before exiting the delivery system. For example, two or more precursor species or samples of process material may be individually processed through the apparatus in thermal isolation at the same or different temperatures prior to exiting a showerhead and condensing on a substrate. Although the process may be described in terms of organic thin films grown or condensed on a substrate or workpiece, the process of the present disclosure may be applied to any CVD, metal-organic chemical vapor deposition, metal-organic vapor phase epitaxy, or thin film deposition process where desirable to maintain controlled and repeatable delivery of process material to improve the resultant film and reduce contamination levels in the system.

Referring now to FIG. 1, deposition system 100 directed towards processing a substrate such as substrate 116 in deposition chamber 110 is shown. In embodiments, deposition chamber 110 may be a CVD chamber manufactured by Applied Materials, Inc. of Santa Clara, Calif., configured to perform process material deposition such as organic precursor deposition in accordance with the present disclosure. One non-limiting system suitable for use or adapted for use in accordance with the present disclosure is the ENDURA® line of processing systems available from Applied Materials, Inc. of Santa Clara, Calif. Other systems may also be used for creating layers such as layers of reacted precursors and additives. However, because the apparatus and method of controlling the flow of a process material may have utility in other system configurations, including systems produced by other manufacturers, other apparatus and methods including atomic layer deposition (ALD), or spin-on processes may be configured to include the apparatus and methods of the present disclosure.

In embodiments, substrate 116 to be processed in accordance with the methods of the present disclosure may be a semiconductor substrate, glass substrate, wafer or workpiece, and may include layers formed there over, such as dielectric layers (e.g., $SiO_2$) and barrier layers (e.g., titanium, titanium nitride and the like). In some embodiments, substrate 116 may include silicon, gallium arsenide, gallium nitride, or combinations thereof and the like. In embodiments, the substrate 116 has a thickness of 50 micrometers to 1.5 millimeters.

In embodiments, a layer (not shown), such as an organic layer, may be formed, condensed, or deposited by a deposition process, or derivatives thereof on substrate 116. In some embodiments, the layer may be formed of one or more process materials. In embodiments, suitable process materials for use in the apparatus and methods of the present disclosure include any material suitable for sublimation and subsequent condensation on a substrate. For example, suitable process materials may include solid materials that may be heated, sublimated, and flowed to a substrate or workpiece to condense and form a layer thereon. In some embodiments, process materials include organic vapors of organometallic compounds, derivatives, or precursors thereof containing for example, a chemical bond between a carbon atom of an organic molecule and a metal such as alkaline, alkaline earth, and transition metals, or metalloids like boron, silicon, and tin. In some embodiments, process materials include metal alkyls and metal carbonyls. In some embodiments, process materials include precursors including metal-oxygen bonds such as metal-alkoxides or metal-β-diketonates or metal-nitrogen bonds such as metal alkyl-amides. In some embodiments, process materials precursors include metal hydrides such as trimethylamine alane.

In some embodiments, a layer (not shown) may be formed on substrate 116 from one or more sublimated or evaporated organic process materials under conditions suitable for condensation on the substrate. In embodiments, one or more process materials in solid form is heated to a vapor form, and allowed to cool or condense on substrate 116. In some embodiments, non-limiting examples of metal nitride process materials include gallium nitride (GaN), aluminum nitride (AlN), and indium nitride (InN). In some embodiments, multiple metals may be suitable as process materials of the present disclosure such as AlGaN and/or InGaN. In some embodiments, the process materials have a purity of greater than 99% such as 99.55, 99.9% and above. Additionally, in some embodiments, dopants, such as silicon (Si) or magnesium (Mg), may be added to the process materials and deposited layer or film. In embodiments, films formed on substrate 116 may optionally be doped by adding small amounts of dopant gases during the deposition process. For silicon doping, silane ($SiH_4$) or disilane ($Si_2H_6$) gases may be used, for example, and a dopant gas may include bis (cyclopentadienyl) magnesium ($Cp_2Mg$ or $(C_5H_5)_2Mg$) for magnesium doping.

In some embodiments, suitable process materials may also include precursors such as Group III precursors including metal organic (MO) precursor such as trimethyl gallium ("TMG"), trimethyl aluminum ("TMAl"), and/or trimethyl indium ("TMI"), but other suitable MO precursors may also be used. In some embodiments, suitable process materials include Group V precursor such as a nitrogen precursor, e.g., ammonia ($NH_3$). In one embodiment, suitable process materials may include a single MO precursor, such as TMG, may be delivered to either first showerhead component 118 or second showerhead component 121 described further below. In another embodiment, suitable process materials include two or more MO precursors, such as TMG and TMI, which may be mixed and delivered to either first showerhead component 118 or second showerhead component 121. In embodiments, suitable process materials include precursors such as Group III precursors previously mentioned herein, however other Group III precursors may be suitable for use as process material as described herein. For example, precursors having the general formula $MX_3$ where M is a Group III element (e.g., gallium, aluminum, or indium) and X is a Group VII element (e.g., bromine, chlorine or iodine) may also be used (e.g., $GaCl_3$). Components of the gas delivery system 150 (described further below) may be suitably adapted to deliver the $MX_3$ precursors to showerhead assembly 112 and substrate 116 in fluid communication with showerhead assembly 112.

In some embodiments, other suitable process materials for processing in accordance with the present disclosure include materials suitable for forming bulk heterojunction layers upon substrate 116. In embodiments, co-evaporation or co-sublimation (in the case of solid precursor(s)) of two or more process materials may be performed to generate a layer on substrate 116. In embodiments, co-deposited heterojunctions including a first green bulk heterojunction precursor process material and a second green bulk heterojunction precursor process material may be suitable process materials for the apparatus and methods of the present disclosure.

In embodiments, process materials are provided in an amount sufficient to form a layer on substrate 116. In embodiments, process materials are provided in an amount sufficient to form a layer on substrate 116 having a predetermined thickness. In some embodiments, process materials condense upon a major surface of substrate 116 in an amount sufficient to form a layer on substrate 116 such as a layer having a thickness of about 50 nanometer to 1 millimeter, 100 nanometers to 350 nanometers, or 150 nanometers to 300 nanometers.

Referring back to FIG. 1, a deposition system 100 is show including deposition chamber 110, and precursor delivery system 120. In embodiments, the deposition system 100 includes deposition chamber 110 downstream of the precursor delivery system 120. In embodiments, precursor delivery system 120 may include one or more heating systems (142 and 142') and one or more gas delivery systems (150 and 150'). In embodiments, the components of deposition system 100 are connected and in communication such that processing material in the one or more heating systems (142 and 142') may be sublimated and subsequently passed through one or more gas delivery systems (150 and 150') into deposition chamber 110. In embodiments, one or more heating systems (142 and 142'), gas delivery systems (150 and 150'), and deposition chamber 110 may be in fluid communication.

In some embodiments, precursor delivery system 120 may include two or more (e.g., several) heating systems such as heating systems (142 and 142') and two or more (e.g., several) gas delivery systems such as gas delivery systems (150 and 150') configured to accommodate one or more (several) samples of the same or different process materials. In embodiments, the inclusion of two or more heating systems (142 and 142') and two or more gas delivery systems (150 and 150') configures the precursor delivery system 120 to isolate one or more process material samples as the sample(s) pass through the precursor delivery system 120 to the deposition chamber 110. For example one or more samples may be thermally isolated so the process material samples are maintained at different temperatures. In embodiments a first process material may pass though the precursor delivery system 120 at a first temperature, and a second process material may pass though the precursor delivery system 120 at the first or a second temperature. In embodiments, the temperature of the first process material will not affect the temperature of the second process material. In embodiments, precursor delivery system 120 may be configured to prevent thermal cross-talk between two or more samples of process materials passing through the precursor delivery system 120, prior to exiting in deposition chamber 110. In embodiments, precursor delivery system 120 may be configured to prevent thermal cross-talk between two or more samples of process materials passing through two or more gas delivery systems (150 and 150'), prior to exiting in deposition chamber 110.

In some embodiments, the deposition system 100 may include components used to execute and monitor pre-determined processes (e.g., depositing films) in the deposition system 100. Such components generally include various sub-systems (e.g., vacuum and exhaust sub-systems, and the like) and devices (e.g., power supplies, process control instruments, and the like) of the deposition system 100. In embodiments, deposition system includes first pump 180, second pump 181, throttle valve 184 and pressure valve 183 to control the pressure of the system and bring or maintain deposition system 100 at vacuum conditions. In embodiments, throttle valve 184 may be open with first pump 180 and second pump 181 pumping to achieve low (760 to 25 Torr), medium (25 to $1 \times 10^{-3}$ Torr) or high vacuum ($1 \times 10^{-3}$ to $1 \times 10^{-9}$) conditions in the deposition system 100. In embodiments, vacuum conditions may be selected and changed depending upon the vapor pressure of the process material. Pressure valve 183 may be included to remove vacuum conditions as desired. In embodiments, the deposition chamber 110 includes or is in fluid communication with an exhaust path 191 downstream the deposition chamber 110. As shown in FIG. 1, the exhaust path 191 divides into a first exhaust flow path 193 and a second exhaust flow path 194. In embodiments, the first exhaust flow path 193 includes a pressure valve 183, and the second exhaust flow path 194 includes a throttle valve 184. As shown in FIG. 1, the one or more conduits (200 and 200') flow into the second exhaust flow path 194 at a first junction 199 downstream the throttle valve 184. In embodiments, a first pump 180 is downstream the first junction 199. In embodiments, the first exhaust flow path 193 and second exhaust flow path 194 merge at a second junction 176 downstream the pressure valve 183 and first pump 180. In embodiments, a second pump 181 is downstream the second junction 176.

In embodiments, deposition system 100 is configured to operate under vacuum conditions to facilitate flow of process material through the precursor delivery system 120 and into deposition chamber 110. In embodiments, the quality of vacuum conditions is lowest at the heating systems (142 and 142'), higher in the gas delivery systems (150, 150') and highest in the deposition chamber 110. In embodiments, a pressure gradient is formed in the system where the heating systems (142 and 142') is at a higher pressure than the gas delivery systems (150 and 150'), which is at a higher pressure than deposition chamber 110. In embodiments, the pressure gradient or vacuum conditions direct the flow of process material sublimated into vapor or gas form from an area of high pressure to an area of low pressure, or low vacuum quality to high vacuum quality. In embodiments, the pressure gradient and vacuum conditions direct the flow of process material from the heating systems (142 and 142'), through the gas delivery systems (150 and 150') into the deposition chamber 110. For example, in embodiments the approximate pressure of the system may include about a vacuum condition such as e.g., $5 \times 10^{-5}$ Torr in the heating systems (142 and 142') near process material source, vacuum conditions such as about $2 \times 10^{-5}$ Torr at the inlet to the showerhead apparatus (adjacent the arrow 223 in FIG. 2) and about $1 \times 10^{-7}$ in the deposition chamber 110.

In embodiments, deposition system 100 is configured to operate at high temperature conditions such as between about 300 degrees Celsius to 550 degrees Celsius, or greater than or equal to 400 degrees Celsius, or greater than 500 degrees Celsius. In some embodiments, deposition system 100 and components thereof are made of material suitable for high temperature operation such as stainless steel. In some embodiments, the gas delivery system 150 during operation will have a temperature about 20 to 40 degrees Celsius above the temperature of the heating system 142 or sublimation temperature of the process material.

Referring back to FIG. 1, deposition system 100 is shown including a deposition chamber 110, one or more sides 111, floor 128, and a lid 130. Showerhead assembly 112, wafer support 114, substrate 116 are also disposed within the deposition chamber 110. In embodiments, deposition chamber 110 is a vacuum deposition chamber. In embodiments, wafer support 114 is configured to rotate substrate 116 during formation of a layer thereon in accordance with the present disclosure. In embodiments, deposition chamber 110 is configured to rotate substrate 116 during formation of a layer thereon in accordance with the present disclosure. In some embodiments, deposition chamber 110 includes a QCM or similar device in order to control the deposition rate, which may be adjusted by temperature. Sensor 144 (e.g., a quartz crystal microbalance) may optionally be disposed adjacent to and in communication with a substrate of the deposition chamber 110. Sensor 144 may be in communication with a controller 147 such as a temperature controller for heat application to substrate 116.

Still referring to FIG. 1, showerhead assembly 112 is shown having a first showerhead component 118 and a second showerhead component 121. However, showerhead assembly 112 may be any showerhead configured to prevent thermal cross-talk between two or more adjacent process materials before exiting the showerhead assembly 112 and condensing on substrate 116. For example, showerhead assembly 112 may be configured to flow two or more species or samples of process material, individually, through the showerhead assembly 112 in thermal isolation, at the same or different temperatures, prior to exiting the showerhead assembly 112, such that the temperature of a first process material does not affect the temperature of a second process material, and vice versa. In some embodiments, showerhead assembly 112 may be configured to deliver process material to deposition chamber 110 without condensing the one or more process material(s) therein.

Referring to FIG. 1, first showerhead component 118 is shown connected to a first temperature sensor 141 which may be a thermocouple, pyrometer, or resistant thermal device suitable for obtaining thermal information from first showerhead component 118 and signaling, communicating or providing feedback to the first temperature controller 124. First temperature controller 124 may be any suitable temperature controller suitable for and configured to receiving input from the first temperature sensor 141 and control, adjust, or set a heat of first heating element 125. First heating element 125 applies heat to the first showerhead component 118. Thus, first heating element 125 applies heat to a first process material including precursors described above passing through first showerhead component 118 at a predetermined temperature, or a first temperature, such as a first set temperature as process material moves towards and into deposition chamber 110 and process volume 171.

Second showerhead component 121 is shown connected to a second temperature sensor 143 which may be a thermocouple, pyrometer, or resistant thermal device suitable for obtaining thermal information from second showerhead component 121 and signaling, communicating or providing feedback to the second temperature controller 126. Second temperature controller 126 may be any suitable temperature controller suitable for and configured to receiving input from the second temperature sensor 143 and control, adjust, or set a heat of second heating element 127. Second heating element 127 applies heat to the second showerhead component 121 and thus may also apply heat to a second process material passing through second showerhead component 121 at a second predetermined temperature, or a second temperature, such as a second set temperature as second process material moves towards and into deposition chamber 110. In embodiments, the first temperature controller 124 and second temperature controller 126 may be configured to control, adjust, or set a heat of the first heating element 125 and second heating element 127 at the same or a different temperature, which may also control, adjust, or set a heat of the first process material and second process material at the same or a different temperature. In embodiments, the first temperature controller 124 and second temperature controller 126 may be configured to control, adjust, or set a heat of the first heating element 125 and second heating element 127 at different temperatures, which may also control, adjust, or set a heat of the first process material and second process material at the same or a different temperature. For example, first showerhead component 118 and second showerhead component 121 may be heated to different temperatures such that the process material therein may also be heated to different temperatures and remain at different temperatures until they pass into process volume 171 for deposition on substrate 116. In some embodiments, a first process material passing through first showerhead component 118 and a second process material passing through the second showerhead component 121 may be held in thermal isolation relative to one another such as for example a difference of 270 to 550 degrees Celsius between the first and second process material. In embodiments, the showerhead assembly 112 is configured to prevent the temperature of the first showerhead component 118 from affecting the temperature of a process material in the second showerhead component 121. In embodiments, the showerhead assembly 112 is configured to prevent the temperature of the second showerhead component 121 from affecting the temperature of a process material in the first showerhead component 118. In embodiments, the showerhead assembly 112 is configured to prevent condensation of different process materials entering the showerhead assembly 112 from one or more gas delivery systems 150.

Still referring to FIG. 1, a precursor delivery system 120, including one or more heating systems 142 and one or more gas delivery systems 150 are shown. The precursor delivery system 120, including heating system 142 and gas delivery system 150 are configured to heat and supply one or more process materials such as one or more organic precursors to deposition chamber 110 for deposition upon substrate 116. In embodiments, the precursor delivery system 120 is suitable for providing a first process material and second process material to the deposition chamber 110 for deposition upon substrate 116 under controlled conditions. For example, the precursor delivery system 120 is suitable for providing a first process material and second process material to the deposition chamber 110 for deposition upon substrate 116 at one or more temperatures, pressures, or concentrations. One or more heating systems 142 and one or more gas delivery system 150 are shown again in FIG. 2 and described in detail below. In embodiments, the precursor delivery system 120 is suitable for providing a first process material and second process material to the showerhead assembly 112 in deposition chamber 110 in thermal isolation, such that the temperature of the first process material does not affect the temperature of the second process material and similarly, the temperature of the second process material does not affect the temperature of the first process material.

Figure 2:
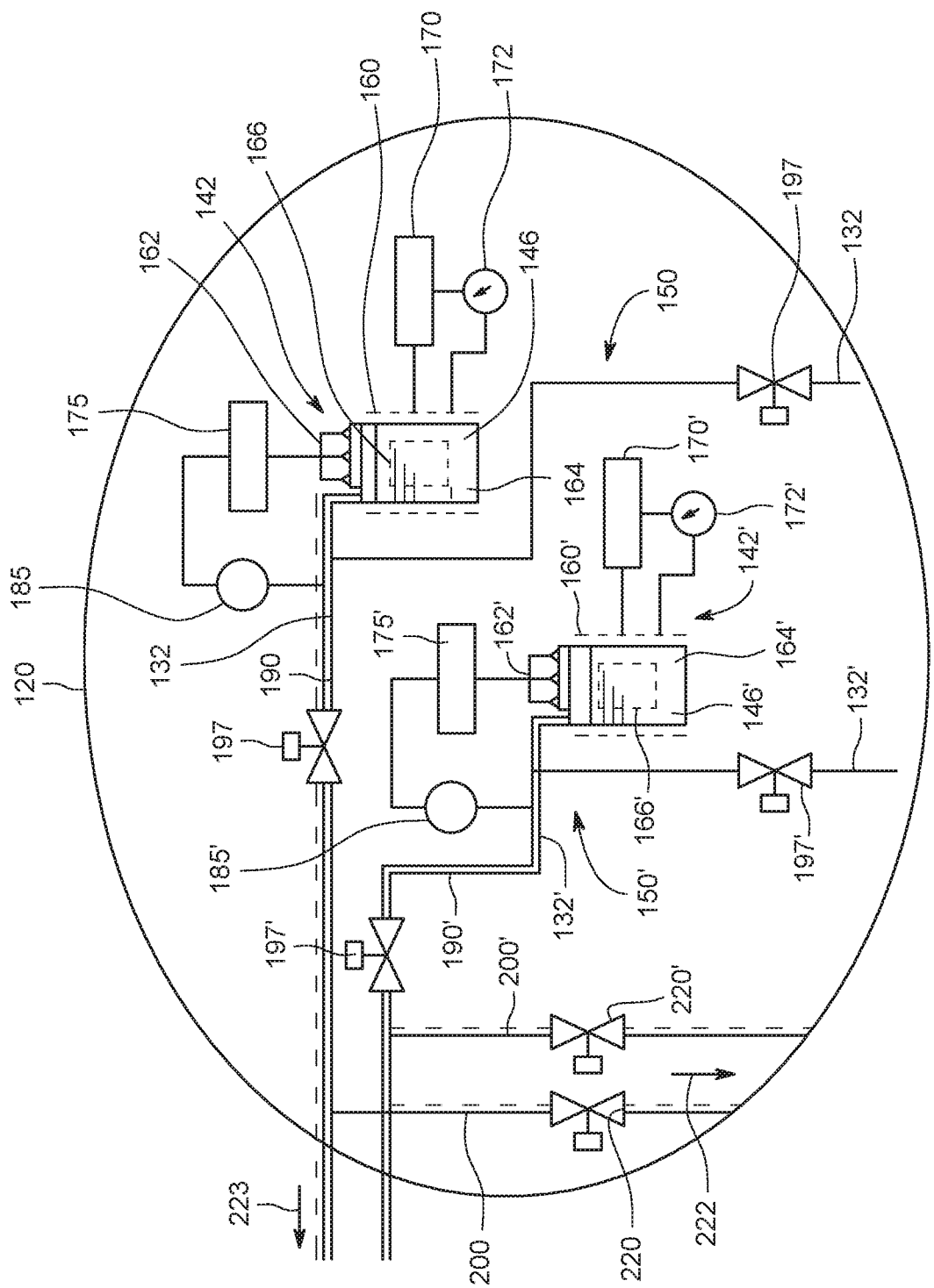
FIG. 2 illustrates a schematic side view of a portion of the deposition system of FIG. 1 where a precursor deliver system including a heating system and gas delivery system are shown in an enlarged view.

Referring now to FIG. 2, precursor delivery system 120, is shown including one or more heating systems (142 and 142') for process material heating and delivery to one or more gas delivery systems (150 and 150'). In embodiments, heating system such as heating systems (142 and 142') is shown including two or more heat sources such as a first heat source (160 and 160') and a second heat source (162 and 162') coupled to one or more sublimators (146 and 146'). In embodiments, one or more sublimators (146 and 146') is shown including a heating jacket (164 and 164') and an ampoule (166 and 166') for containing process material such as source material suitable for condensing upon substrate 116 in the deposition chamber 110 (FIG. 1). In some embodiments, one or more sublimators (146 and 146') includes two or more heat sources such as a first heat source (160 and 160') and a second heat source (162 and 162'). In some embodiments, one or more sublimators (146 and 146') include a first heat source (160 and 160') and a second heat source (162 and 162'), wherein the first heat source (160 and 160') is suitable for heating process material to a first temperature ($T_1$) near a boiling point or sublimation temperature of a process material, and wherein the second heat source (162 and 162'), is suitable for heating process material from the first temperature ($T_1$) to a second temperature ($T_2$) at or above a boiling point or sublimation temperature of the process material. In embodiments, the one or more sublimators (146 and 146') include a multi-zone heater.

In some embodiments, one or more first heat sources such as first heat source 160 may include one or more radiant heaters disposed proximate the ampoule such as ampoule 166, or a heater circumscribing ampoule such as ampoule 166 in the form of heating jacket (164 and 164'). In some embodiments, as first heat source (160 and 160') may be fabricated from any material suitable to transfer heat from a first heat source (160 and 160') to the ampoule (166 and 166'). In some embodiments, the one or more first heat source (160 and 160') may include radiant heaters which may be fabricated from silicon carbide (SiC). In some embodiments, the temperature of the one or more heat sources such as first heat source (160 and 160') may be monitored by a temperature sensor (172 and 172') or monitoring device (e.g., a pyrometer) disposed in heating systems (142 and 142'). The temperature sensor (172 and 172') may be any temperature sensor configured to signal or communicate temperature information to third temperature controller (170 and 170'). Third temperature controller (170 and 170') may be any suitable temperature controller suitable for and configured to receiving input from the temperature sensor (172 and 172') and control, adjust, or set a heat of first heat source (160 and 160'). In embodiments, a heat source such as first heat source (160 and 160') applies heat to the heating jacket (164 and 164') and thus may also apply heat to a process material disposed within ampoule (166 and 166'). In embodiments, the first heat source (160 and 160') is suitable for heating the ampoule (166 and 166') and contents thereof to a temperature in the amount of 250 to 350 degrees Celsius. In embodiments, second heat source (162 and 162') is suitable for heating the ampoule (166 and 166') and contents thereof to a temperature in the amount of 350 to 550 degrees Celsius.

Still referring to FIG. 2, one or more sublimators (146 and 146') is shown including a temperature controller such as third temperature controller (170 and 170') for controlling the heat of first heat source (160 and 160'). First heat source (160 and 160') adjusts or maintains the temperature of a process material within one or more sublimators (146 and 146') to a set temperature. Third temperature controller (170 and 170') is shown connected to a temperature sensor (172 and 172') such as a third temperature sensor. In embodiments, temperature sensor (172 and 172') is suitable for measuring the temperature of process material passing within one or more sublimators (146 and 146') and facilitating the adjustment thereof by communicating with third temperature controller (170 and 170').

In some embodiments, one or more heating systems (142 and 142') may include two or more heat sources such as a first heat source (160 and 160') and a second heat source (162 and 162') coupled to one or more sublimators (146 and 146'). In some embodiments, one or more sublimators (146 and 146') include a first heat source (160 and 160') and a second heat source (162 and 162'), wherein the first heat source (160 and 160') is suitable for heating process material to a first temperature near a boiling point or sublimation temperature of a process material, and wherein the second heat source (162 and 162') is suitable for heating process material from the first temperature to a second temperature at or above a boiling point or sublimation temperature of the process material.

In some embodiments, second heat source (162 and 162') may include one or more heating lamps in contact with or adjacent one or more sublimators (146 and 146'). In some embodiments, the one or more second heat source (162 and 162') such as heating lamps may be monitored by a temperature monitoring device, or sensor (185 and 185'), (e.g., a quartz crystal microbalance) disposed adjacent to and in communication with a delivery line (190 and 190') configured as a tube in the gas delivery system (150 and 150'). The temperature monitoring device may also be suitable to signal a fourth temperature controller (175 and 175') such as a lamp controller for heat application to ampoule (166 and 166'). In embodiments, the sensor (185 and 185') may also be used to control or set the concentration of sublimated vapor material entering the gas delivery system (150 and 150').

In some embodiments, the second heat source (162 and 162') may include a plurality of lamps arranged, for example, across or in concentric circles or zones (not shown in FIG. 2) adjacent to ampoule (166 and 166'), and each lamp zone may be separately powered. In one embodiment, one or more temperature sensors, such as sensor (185 and 185'), may be disposed within the precursor delivery system 120 in communication with the one or more heating systems (142 and 142') and one or more gas delivery systems (150 and 150'). Sensor (185 and 185') is configured to monitor process material and reactive gas temperatures. In embodiments, sensor (185 and 185') is configured to communicate temperature data or information to a fourth temperature controller (175 and 175') which can adjust power to separate lamp zones to maintain a predetermined temperature profile across the ampoule (166 and 166'). In another embodiment, the power to separate lamp zones may be adjusted to compensate for precursor flow or precursor concentration nonuniformity. For example, if the precursor concentration is lower in the one or more gas delivery systems (150 and 150') near an outer lamp zone adjacent the top of the ampoule (166 and 166'), the power to the outer lamp zone may be adjusted to help compensate for the process material or precursor depletion in one or more gas delivery systems (150 and 150'). In embodiments, lamps may heat the process materials to a temperature of about 400 degrees Celsius to about 1200 degrees Celsius. The disclosure is not restricted to the use of arrays of lamps. Any suitable heating source may be utilized to ensure that the proper temperature is adequately applied to the ampoule (166 and 166') and process materials therein. For example, in another embodiment, the heating source may include resistive heating elements (not shown) which are in thermal contact with the ampoule (166 and 166').

In embodiments, the second heat source (162 and 162') may include two or more heating lamps. The heating lamps may be any type of heating lamp suitable to heat the one or more ampoules (166 and 166') to a desired temperature. For example, in some embodiments, the second heat source (162 and 162') heating lamps may be similar to lamps utilized in a rapid thermal process chamber (RTP) or an epitaxial (EPI) chamber. In such embodiments, the heating lamps may have a capacity of up to about 650 W (e.g. such as RTP process chamber lamps), or in some embodiments up to about 2 kW (e.g., such as EPI process chamber lamps). Any number of heating lamps may be utilized in any configuration suitable to provide adequate and efficient heating of the one or more ampoules 166. For example, in some embodiments, one to three heating lamp per sublimator (146 and 146') may be disposed about the sublimator 146. Alternatively or in combination, other heating mechanisms may be utilized such as resistive heaters or heat exchangers. In embodiments, the second heating source 162 may be positioned proximate the gas delivery system 150, such that the heat can be applied to the process material adjacent to the gas delivery system 150 to facilitate flow of process material into the gas delivery system 150. Additional heating sources may be positioned proximate the gas delivery lines and conduits as shown by the dotted lines adjacent to delivery line (190 and 190') and conduits (200 and 200') in FIG. 2.

During processing, second heat source (162 and 162') may include lamps as sources of infrared (IR) radiation (i.e., heat) and, in operation, generate a pre-determined temperature distribution across the sublimator. The ampoule (166 and 166') may be formed from quartz; however, other IR-transparent and process compatible materials may also be used to form these components. For example, heating lamps may be part of a multi-zone lamp heating apparatus to provide thermal uniformity to the top side of the sublimator. In embodiments, one or more heating systems (142 and 142') may include a plurality of heating zones, where each heating zone includes a plurality of lamps. For example, the one or more lamps may be a first heating zone and one or more other lamps may be a second heating zone. One or more sublimators 146 may be temperature controlled, for example, by active cooling, or the like, to further aid control of thermal control of the sublimator, and/or on the process material such as organic precursors therein.

In some embodiments, heating system 142 may include two or more heat sources such as a first heat source 160 and a second heat source 162 coupled to one or more sublimators 146, wherein the first heat source is a radiant heat source adjacent the ampoule and a second heat source is adjacent an opening in the ampoule, such as an opening between a delivery line and an ampoule. In embodiments, the second heating source is above and adjacent the opening. In embodiments, the second heating source includes one or more infrared (IR) radiation heat sources. In some embodiments, the first heat source is configured to heat a process material when present in the ampoule to a first temperature, and the second heat source is configured to heat the process material to a second temperature greater than the first temperature.

Still referring to FIG. 2, one or more sublimators 146 is shown including a fourth temperature controller (175 and 175') for controlling the heat of second heat source (162 and 162'). Second heat source 162 adjusts or maintains the temperature of a process material within one or more sublimators 146 to a set temperature. Fourth temperature controller 175 is shown connected to sensor 185 described above. Fourth temperature controller 175 such as a thermocouple is suitable for adjusting or setting the temperature of process material passing within one or more sublimators 146 and facilitating the adjustment thereof by communicating with sensor 185.

Still referring to FIG. 2, one or more gas delivery systems (150 and 150') are shown including a first gas delivery line (132 and 132'). In embodiments, gas delivery system 150 is connected in fluid communication with heating system 142 and deposition chamber 110 (FIG. 1). Generally, fluid communication may refer to a configuration where two or more elements being in fluid communication can exchange fluid, gas or vapor via a connection, allowing fluid, gas or vapor to flow between the two elements. For example, process material sublimed or evaporated in the heating system 142 may flow into gas delivery systems 150, through delivery line 190, and into process volume 171 (FIG. 1). In embodiments, gas delivery systems 150 is in fluid communication with deposition chamber 110 allowing processing material under vacuum and sublimed or evaporated in the heating system 142 to be carried or pushed from sublimator 146 such as first sublimator, through gas delivery system 150, delivery line 190, showerhead assembly 112, and into process volume 171 (shown in FIG. 1).

Referring to FIG. 2, gas delivery systems (150 and 150') include one or more first gas delivery lines (132 and 132') such as first gas delivery line 132 for guiding and distributing evaporated or sublimed process material from sublimator (146 and 146'). In embodiments, the first gas delivery line (132 and 132') may guide the evaporated or sublimed process material from the sublimator (146 and 146') to an outlet in the processing chamber, such as showerhead assembly 112. In embodiments, the first gas delivery line (132 and 132') may be configured of material suitable for withstanding high temperatures. In some embodiments, delivery line 190 is a portion of the first gas delivery line 132 and is a linear distribution pipe and may be understood as a pipe including a pipe having the shape of a cylinder, wherein the cylinder may have a circular bottom shape or any other suitable bottom shape.

In some embodiments, process material, carrier gas, or purge gas may flow through delivery line 190. As explained above, sensor 185, (e.g., a quartz crystal microbalance) may, in embodiments, be optionally connected to delivery lines 190 and may be used to monitor the flow rate of process material such as evaporated precursor or temperature thereof. However, in some embodiments, the first gas delivery lines (132 and 132') and portion of delivery line (190 and 190') are under vacuum and do not contain gas apart from any sublimated process material.

In some embodiments, gas delivery systems (150 and 150') may include multiple gas sources. In embodiments, different gases, such as purge gases, or others may be supplied to the gas delivery systems (150 and 150') via first gas delivery line (132 and 132'). The first gas delivery line (132 and 132') may include one or more shut-off valves such as second valve (197 and 197') and mass flow controllers or other types of controllers to monitor and regulate or shut off the flow of gas in each line. In embodiments, the gas delivery systems (150 and 150') is under vacuum and devoid of gases other than the sublimated process materials in gas or vapor form.

In another embodiment, the gas delivery systems (150 and 150') and heating system (142 and 142') may be configured so that process material in gas or vapor form may be supplied to deposition process volume such as process volume 171 to condense and form layers, such as III-V films, for example, on substrates 116.

In embodiments, gas delivery systems (150 and 150') may further include one or more conduits such as conduit (200 and 200') connected to the first gas delivery line (132 and 132') at a junction between the sublimator (146 and 146') and the showerhead assembly 112 (not shown in FIG. 2). In embodiments, the conduit junction is between the sublimator (146 and 146') and the deposition chamber 110. In some embodiments, an exhaust valve such as valve (220 and 220') may be opened or closed to adjust the flow of process material, and adjust the pressure in the first gas delivery line (132 and 132') and deposition chamber 110. Valve (220 and 220') is disposed within the system such that when valve 220 opens (e.g., is in an open position), deposition of process material such as organic precursor in deposition chamber 110 ceases. In embodiments, valve 220 is disposed within the system such that when valve 220 closes (e.g., is in a closed position), deposition of process material such as organic precursor in deposition chamber 110 begins, or continues. In embodiments, suitable exhaust valve such as valve (220 and 220') include one or more valves configured and capable of working at high temperatures such as above 400 degrees Celsius, or between 400 degrees Celsius and 1500 degrees Celsius. In embodiments, the process volume 171 pressure may be controlled by operating valve (220 and 220') which controls the rate at which the exhaust gases are drawn from the gas delivery systems (150 and 150').

In some embodiments, the gas delivery system 150 and portions thereof such as first gas delivery line 132 and second valve 197 should have a temperature greater than or equal to that of the process material contained therein. For example, depending upon the evaporation or sublimation temperature of the process material, the temperature of the gas delivery system 150 should be equal to or above the temperature of the process material in order to prevent or minimize condensation within the gas delivery system. Further, the gas delivery system 150 and components thereof should be made of material suitable for high temperature operation such as above 300 degrees Celsius, above 400 degrees Celsius, above 500 degrees Celsius and beyond.

In embodiments, gas delivery system (150 and 150'), while under vacuum conditions, may be adjusted by setting the second valve (197 and 197') and valve (220 and 220') in predetermined positions to change the pressure in the system and facilitate movement of process material. For example, opening second valve 197 allows process material from heating system (142 and 142') to flow towards deposition chamber 110. When second valve 197 is open and valve 220 is open, process material is directed away from the deposition chamber 110 in the direction of arrow 222. When second valve 197 is open and valve 220 is closed, process material is directed into the deposition chamber 110 in the direction of arrow 223 along the path of least resistance, or lower pressure. During operation, when substrate is placed on the pedestal in the chamber, valve 220 is closed in order to redirect the flow of process material into the deposition chamber 110. In some embodiments, and in order to preserve process material, valve 220 may be opened and second valve 197 may throttle down to restrict flow from the source to save process materials. At the start of the next deposition cycle, second valve 197 is opened to resume deposition.

In some embodiments, gas delivery system 150 includes a QCM or similar device in order to control the deposition rate, which may be adjusted by temperature. Sensor 185 (e.g., a quartz crystal microbalance) may be disposed adjacent to and in communication with a delivery line 190 of the gas delivery system 150. The temperature monitoring device may also be suitable to signal a fourth temperature controller 175 such as a lamp controller for heat application to ampoule 166.

Figure 3:
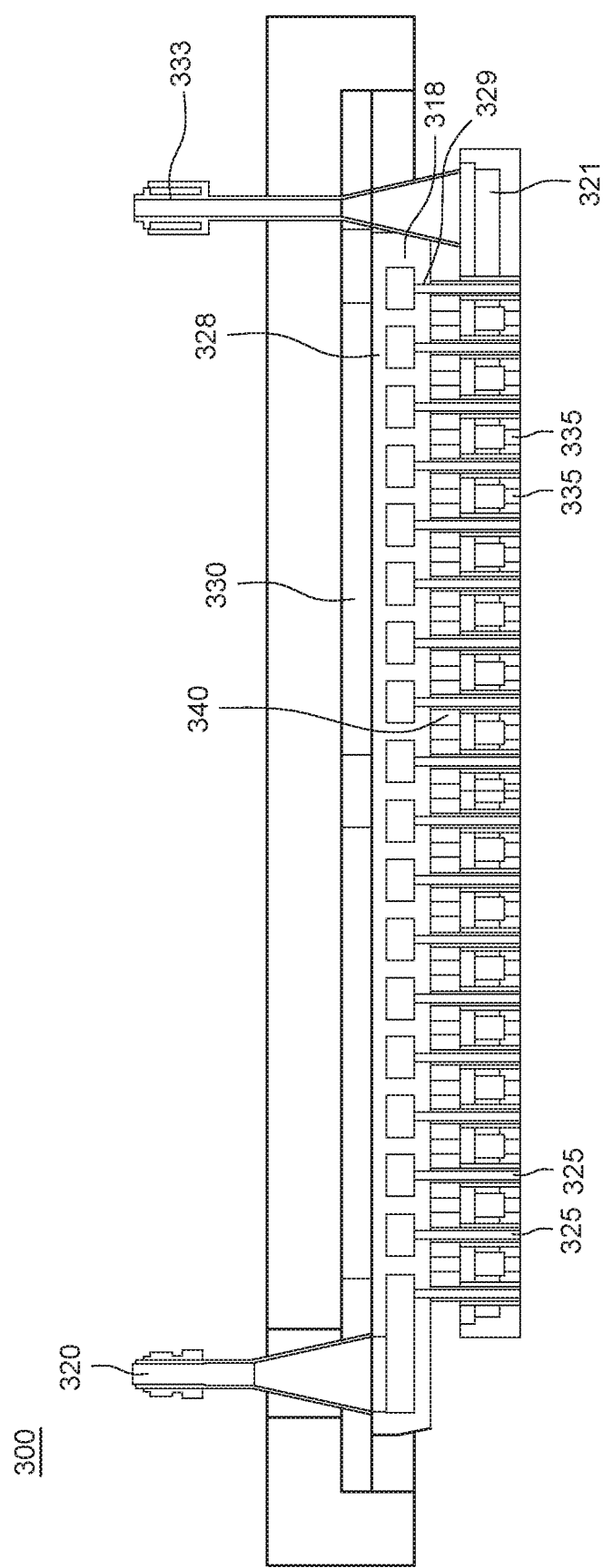
FIG. 3 illustrates a schematic side view of one showerhead assembly embodiment in accordance with the present disclosure.

In embodiments, process material, such as one or more organic precursors are delivered from the second showerhead component 121 to a substrate 116 in the deposition chamber 110. Referring now to FIG. 3, a schematic side view of a showerhead assembly 300 in accordance with the present disclosure is shown. In embodiments, showerhead assembly 300 includes a first showerhead component 318 and a second showerhead component 321. First showerhead component 318 includes an inlet 320, a plurality of outlets 325, a needle 328, and a sleeve 329. A pillar 330 is disposed upon the first showerhead component 318. Second showerhead component 321 is also shown comprising a second inlet 333, and a plurality of outlets 335. An insulating layer 340 is provided between the first showerhead component 318 and second showerhead component 321. In embodiments, showerhead assembly 300 is configured to thermally isolate process materials passing through the showerhead assembly 300 originating from separate sources.

Figure 4:
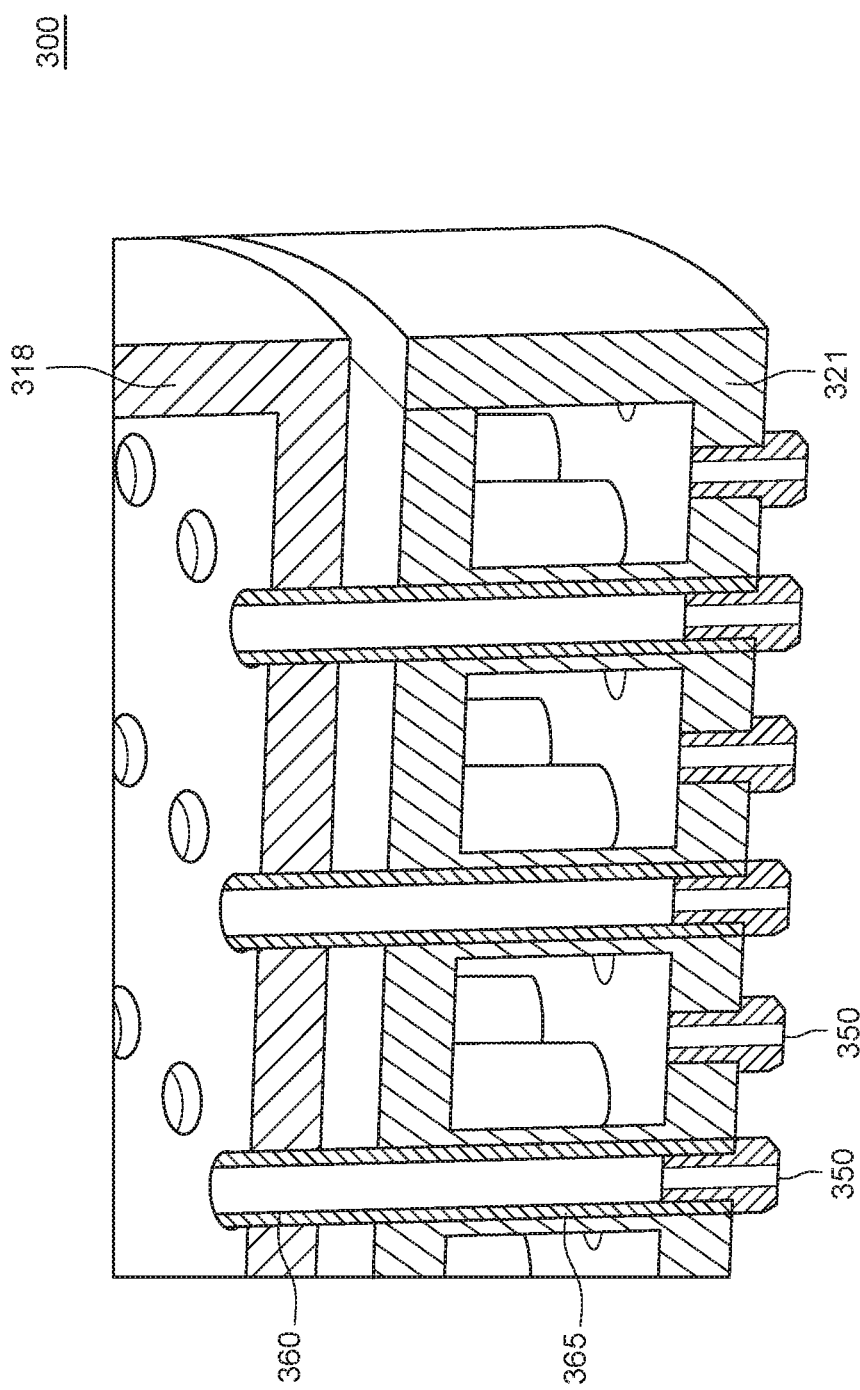
FIG. 4 illustrates a schematic side view of a portion of the showerhead assembly of FIG. 3.

Referring not to FIG. 4, a schematic side view of a portion of the showerhead assembly 300 of FIG. 3 is shown in cross-section. In embodiments, showerhead assembly 300 includes a first showerhead component 318 and a second showerhead component 321. First showerhead component 318 includes a plurality of upper nozzle tubes 360 and a plurality of upper nozzle feed through tubes 365. A plurality of nozzles 350 are shown. Nozzles 350 are shown connected to and in fluid communication with upper nozzle tubes 360, and second showerhead component 321. Generally, the plurality of nozzles 350 are positioned to one side of the showerhead assembly 300 for positioning adjacent to substrate 116 (FIG. 1). In embodiments, showerhead assembly 300 is configured to thermally isolate process materials passing through the showerhead assembly 300 but originating from separate sources.

In some embodiments, a showerhead assembly 300 directs a flow of one or more process materials toward a first side of a substrate 116 (FIG. 1). In some embodiments, a first process material may include materials such as organic precursors described above. In embodiments, the first showerhead component 318 may be connected to and in fluid communication with a first gas delivery system such as gas delivery system 150, and the second showerhead component 321 may be connected to and in fluid communication with a second gas delivery system e.g., shown as 150'. In embodiments, the first and second gas delivery systems may contain one or more different processing materials, which may be delivered to the respective showerhead components at different temperatures and pressures depending upon process needs. Referring to FIG. 3, first showerhead component 318 may have a first set of nozzles 350 for a first processing material delivery, and a second showerhead component 321 may have a second set of nozzles 350 for a second processing material delivery. In embodiments, nozzles 350 have a pitch in the amount of between 10 to 20 millimeters. In embodiments, the nozzles have an opening in the amount of 0.5 to 2, or about 1 millimeter. In some embodiments, the first processing material includes the same precursor as the second processing material. In some embodiments, the first processing material includes a different precursor than the second processing material.

In some embodiments, the flow rate of process material through the first showerhead component 318 and a second showerhead component 321 is about 300 SLM to about 500 SLM. In some embodiments, one or more heating elements (such as first heating element 125 and second heating element 127 shown in FIG. 1) are coupled to the showerhead assembly 300 to heat the showerhead assembly 300 to a temperature at or above the evaporation or sublimation temperature of the process material. In some embodiments, the heater 227 may be an electric coil wrapped around the showerhead assembly 300 or embedded in the showerhead assembly 300. In some embodiments, the showerhead 228 is heated to a temperature at or above the evaporation or sublimation temperature of the process material. In some embodiments, the showerhead assembly is heated so that the first showerhead component 318 and second showerhead component 321 are at different temperatures to provide showerhead temperature control and isolation between two or more process materials. In some embodiments, the showerhead assembly is heated so that the first showerhead component 318 may operate at about 550 degrees Celsius and second showerhead component 321 may operate at a temperature of about 270 degrees Celsius. In embodiments, the showerhead assembly 300 design allows for uniform deposition across the substrate.

Figure 5:
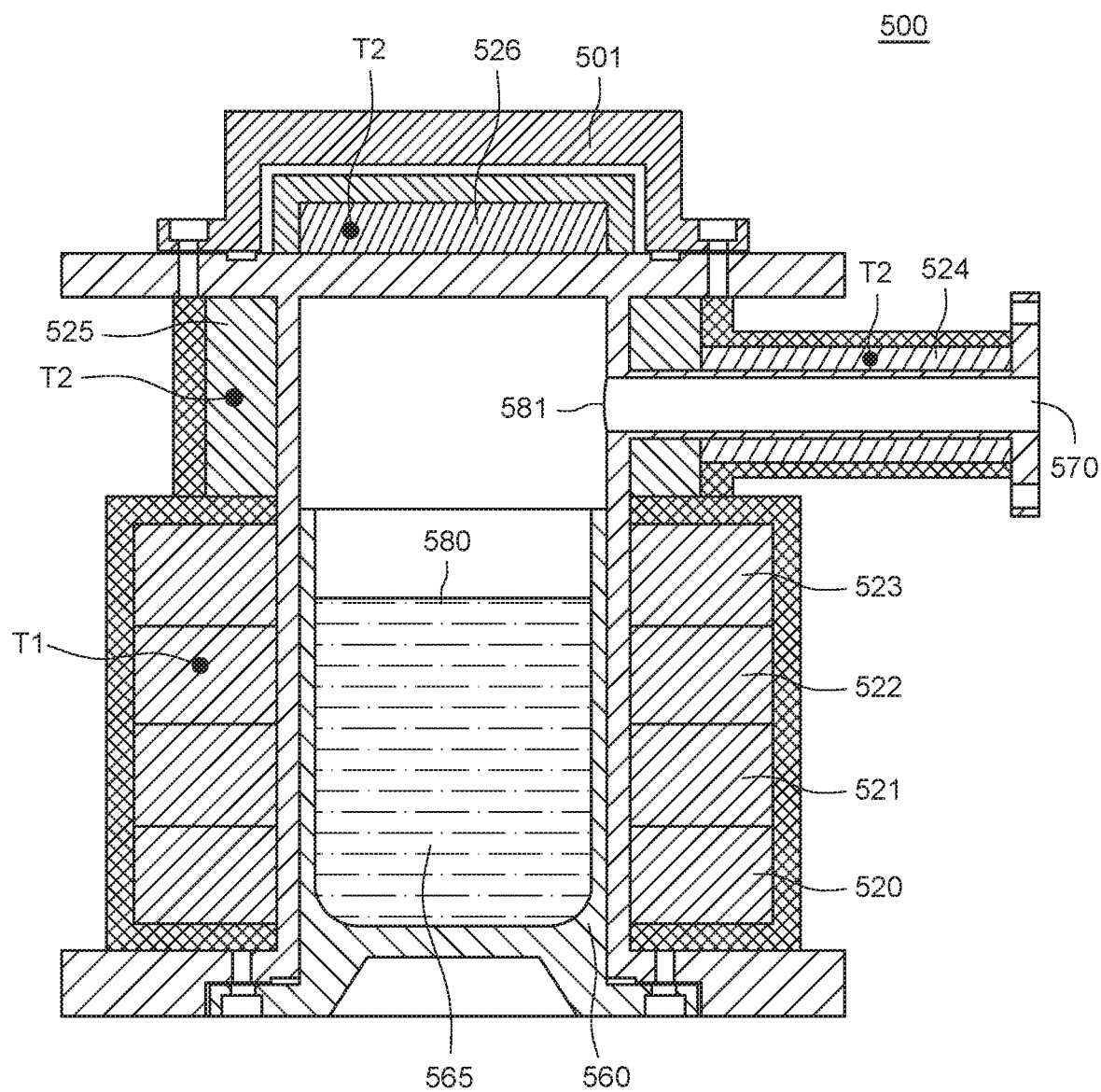
FIG. 5 illustrates a schematic side view of a heating apparatus suitable for use in a system of the present disclosure.

Referring now to FIG. 5, another heating apparatus 500 suitable for use in the system of the present disclosure is shown. A sublimator 501 is shown including ampoule 560 and multiple heating zones (T1 and T2) to provide controlled zonal heating to the process material 565 in ampoule 560. In embodiments, sublimator 501 may be temperature controlled, for example, by active heating, or the like, to further aid control of thermal control of the sublimator 501, and/or on the process material 565 such as organic precursors therein. For example, one or more heaters such as 520, 521, 522, 523, 524, 525, or 526 may be part of a multi-zone heating apparatus to provide thermal uniformity to the sublimator. In embodiments, the sublimator 501 may include a plurality of heating zones, where each heating zone includes a plurality of heaters. For example, the one or more heaters 520, 521, 522 or 523 may be a first heating zone T1 and one or more other heaters such as 524, 525 or 526 may form a second heating zone T2. In some embodiments, one or more heaters such as 520, 521, 522, or 523 may include one or more radiant heaters disposed proximate to the ampoule 560, or a heater circumscribing the ampoule 560 in the form of heating jacket. In some embodiments, one or more heaters such as 520, 521, 522, 523, 524, 525, or 526 may be fabricated from any material suitable to transfer heat from the heater to the ampoule 560. In embodiments, the heating zone T1 is suitable for heating the ampoule 560 and contents thereof to a first temperature in the amount of 250 to 350 degrees Celsius. In embodiments, second heat zone T2 is suitable for heating the ampoule 560 and contents thereof to a second temperature in the amount of 350 to 550 degrees Celsius. In embodiments, sublimated or evaporated process material may exit the sublimator 501 through conduit 570. In embodiments, heating apparatus 500 includes a first heat source and a second heat source, wherein the first heat source is a radiant heat source, such as 520, 521, 522, or 523, adjacent the ampoule and a second heat source such as one or more of 524, 525, or 526 adjacent the opening 581. In embodiments, one or more second heat sources such as one or more of 524, 525, or 526 adjacent the opening 581 may include one or more heat lamps to heat the process material when present in the ampoule 560. In embodiments, the ampoule 560 comprises process material filled to a fill line 580. In embodiments, the second heat sources are located above and/or adjacent to the fill line 580. In embodiments, opening 581 is in fluid communication and connected with a delivery line. In embodiments, opening 581 is disposed above the fill line 580 within the heating apparatus 500.

In embodiments, one or more controllers may be coupled to the deposition system 100 and support systems, directly (not shown) or, alternatively, via computers (or controllers) associated with the process chamber and/or the support systems. In embodiments, the controller may be one of any form of general-purpose computer processor that can be used in an industrial setting for controlling various chambers and sub-processors. The memory, or computer-readable medium of a CPU may be included including be one or more of readily available memory such as random access memory (RAM), read only memory (ROM), floppy disk, hard disk, or any other form of digital storage, local or remote. In embodiments, support circuits are coupled to a CPU for supporting the processor in a conventional manner. These circuits include cache, power supplies, clock circuits, input/output circuitry and subsystems, and the like.

In some embodiments, the present disclosure relates to a non-transitory computer readable medium having instructions stored thereon that, when executed, cause a method for controlling a flow of process material to a deposition chamber, including: sublimating one or more precursor materials in one or more sublimators to form one or more vapor precursors; flowing the one or more vapor precursors through one or more delivery lines in fluid communication with a deposition chamber; wherein the one or more delivery lines are connected to one or more conduits at a junction between the deposition chamber and one or more sublimators; and setting one or more valves in the one or more conduits to control a flow of precursor material from the one or more sublimators to the deposition chamber.

In some embodiments the present disclosure relates to an apparatus for controlling a flow of process material to a deposition chamber, including: a deposition chamber in fluid communication with one or more sublimators through one or more delivery lines, wherein the one or more sublimators each include an ampoule in fluid communication with the one or more delivery lines through an opening, and at least a first heat source and a second heat source, wherein the first heat source is a radiant heat source adjacent the ampoule and a second heat source is adjacent the opening, wherein the one or more delivery lines include one or more conduits between the deposition chamber and the one or more sublimators, and wherein the one or more conduits includes one or more valves to open or close the one or more conduits, wherein the one or more valves in an open position prevents the flow of process material into the deposition chamber when process material is present in the one or more delivery lines, and wherein the one or more valves in a closed position directs the flow of process material into the deposition chamber when process material is present in the one or more delivery lines. In some embodiments, the second heating source is above and adjacent the opening. In some embodiments, the second heating source includes one or more infrared (IR) or broadband radiation heat sources. In some embodiments, the first heat source is configured to heat a process material when present in the ampoule to a first temperature, and the second heat source is configured to heat the process material to a second temperature greater than the first temperature. In some embodiments, the deposition chamber includes an exhaust path downstream the deposition chamber. In some embodiments, the exhaust path divides into a first exhaust flow path and a second exhaust flow path. In some embodiments, the first exhaust flow path includes a pressure valve, and the second exhaust flow path includes a throttle valve. In some embodiments, the one or more conduits flow into the second exhaust flow path at a first junction downstream the throttle valve. In some embodiments, a first pump is downstream the first junction. In some embodiments, the first exhaust flow path and second exhaust flow path merge at a second junction downstream the pressure valve and first pump. In embodiments, a second pump is downstream the second junction. In embodiments, the first heat source includes a radiant heat source and the second heat source includes an infrared (IR) radiation heat source, and wherein the radiant heat source and infrared (IR) radiation heat source are in different heat zones. In some embodiments, the infrared (IR) radiation heat source is connected to a sensor. In embodiments, the one or more delivery lines further includes a second valve positioned between one or more conduits and one or more sublimators. In embodiments, the one or more valves control a process volume pressure of the deposition chamber.

Referring now to FIG. 6, a method 600 for controlling a flow of process material to a deposition chamber in accordance with the present disclosure is shown. At 602, the process sequence includes sublimating one or more precursor materials in one or more sublimators to form one or more vapor precursors, wherein the one or more sublimators each include an ampoule in fluid communication with one or more delivery lines through an opening, and at least a first heat source and a second heat source, wherein the first heat source is a radiant heat source adjacent the ampoule and a second heat source is adjacent the opening. At 604, the process sequence of method 600 includes flowing the one or more vapor precursors through one or more delivery lines in fluid communication with a deposition chamber; wherein the one or more delivery lines are connected to one or more conduits at a junction between the deposition chamber and one or more sublimators. At 606, the process sequence of method 600 includes setting one or more valves in the one or more conduits to control a flow of precursor material from the one or more sublimators to the deposition chamber. In embodiments, the method includes setting one or more valves in an open position to prevent the flow of process material into the deposition chamber, and wherein setting one or more valves in a closed position directs the flow of process material into the deposition chamber. In embodiments, flowing the one or more vapor precursors through one or more delivery lines in fluid communication with a deposition chamber includes maintaining a temperature of the one or more vapor precursors flowing through one or more delivery lines. In embodiments, flowing the one or more vapor precursors through one or more delivery lines in fluid communication with a deposition chamber includes maintaining a temperature of a first vapor precursor at a first temperature as the first vapor precursor flows through a first delivery line, and maintaining the temperature of a second vapor precursor at a second temperature as the first vapor precursor flows through a second delivery line.

In one embodiment, the present disclosure relates to an apparatus for controlling a flow of process material to a deposition chamber, including: a deposition chamber in fluid communication with one or more sublimators through one or more delivery lines, wherein the one or more delivery lines include one or more conduits between the deposition chamber and the one or more sublimators, and wherein the one or more conduits includes one or more valves to open or close the one or more conduits, wherein the one or more valves in an open position prevents the flow of process material into the deposition chamber when process material is present in the one or more delivery lines, and wherein the one or more valves in a closed position directs the flow of process material into the deposition chamber when process material is present in the one or more delivery lines. In embodiments, the apparatus further includes an exhaust path downstream of the deposition chamber. In embodiments, the exhaust path divides into a first exhaust flow path and a second exhaust flow path. In embodiments, the first exhaust flow path includes a pressure valve, and the second exhaust flow path includes a throttle valve. In embodiments, one or more conduits flow into the second exhaust flow path at a first junction downstream the throttle valve. In embodiments, a first pump is downstream the first position. In embodiments, the first exhaust flow path and second exhaust flow path merge at a second junction downstream of the pressure valve and first pump. In some embodiments, a second pump is downstream of the second junction. In some embodiments, one or more sublimators each include two or more heat sources. In some embodiments, the two or more heat sources include a radiant heat source and an infrared (IR) or broadband radiation heat source, wherein the radiant heat source and infrared (IR) or broadband radiation heat source are in different heat zones. In some embodiments, the infrared (IR) radiation heat source is connected to a sensor. In some embodiments, the one or more delivery lines further includes a second valve positioned between one or more conduits and one or more sublimators. In some embodiments, the one or more valves are suitable for use at a temperature of at least 400 degrees Celsius. In some embodiments, the one or more valves control a process volume pressure of the deposition chamber.

While the foregoing is directed to embodiments of the present disclosure, other and further embodiments of the disclosure may be devised without departing from the basic scope thereof.

The invention claimed is:

1. An apparatus for controlling a flow of process material to a deposition chamber, comprising:
the deposition chamber in fluid communication with one or more sublimators through one or more delivery lines, wherein the one or more sublimators each comprise an ampoule in fluid communication with the one or more delivery lines through an opening disposed in a sidewall of the ampoule, and the ampoule includes at least a first temperature zone having a plurality of first heaters, the first temperature zone corresponding with a lower portion of each of the sublimators by having the plurality of first heaters surrounding lower portions of the sidewall of the ampoule, and a second temperature zone having one or more second heaters, the second temperature zone corresponding with an upper portion of each of the sublimators by having the one or more second heaters disposed adjacent the opening, surrounding upper portions of the sidewall of the ampoule, and adjacent a top plate of the ampoule,
wherein the one or more delivery lines comprise one or more conduits between the deposition chamber and the one or more sublimators, and wherein the one or more conduits comprises one or more valves to open or close the one or more conduits, wherein the one or more valves in an open position prevents the flow of process material into the deposition chamber when process material is present in the one or more delivery lines, and wherein the one or more valves in a closed position directs the flow of process material into the deposition chamber when process material is present in the one or more delivery lines.

2. The apparatus of claim 1, wherein the plurality of first heaters comprise a plurality of radiant heat sources, and the one or more second heaters comprise a plurality of second heaters.

3. The apparatus of claim 1, wherein the one or more second heaters comprise one or more infrared (IR) or broadband radiation heat sources.

4. The apparatus of claim 1, wherein the heater adjacent the top plate of the ampoule is disposed above the top plate.

5. The apparatus of claim 1, wherein the deposition chamber comprises an exhaust path downstream of the deposition chamber, wherein the exhaust path divides into a first exhaust flow path and a second exhaust flow path, wherein the first exhaust flow path comprises a pressure valve, and the second exhaust flow path comprises a throttle valve, wherein the one or more conduits connect into the second exhaust flow path at a first junction downstream the throttle valve, wherein a first pump is downstream the first junction, wherein the first exhaust flow path and second exhaust flow path merge at a second junction downstream the pressure valve and first pump, and wherein a second pump is downstream of the second junction.

6. The apparatus of claim 1, wherein the first heat source comprises a radiant heat source and the second heat source comprises an infrared (IR) or broadband radiation heat source, and wherein the radiant heat source and infrared (IR) or broadband radiation heat source are in different heat zones.

7. The apparatus of claim 1, wherein the first heat source is configured to heat the ampoule to a temperature of 250 to 350 degrees Celsius, and the second heat source is configured to heat the ampoule to a temperature of 350 to 550 degrees Celsius.

8. The apparatus of claim 1, wherein the one or more delivery lines further comprises a second valve positioned between one or more conduits and one or more sublimators.

9. The apparatus of claim 1, wherein the one or more valves control a process volume pressure of the deposition chamber.

10. A method for controlling a flow of process material to a deposition chamber, comprising:
sublimating one or more precursor materials in one or more sublimators to form one or more vapor precursors, wherein the one or more sublimators each comprise an ampoule in fluid communication with one or more delivery lines through an opening, wherein the opening defines a sole gas flow path into or out of an interior volume of the ampoule, and the ampoule includes at least a first temperature zone having a plurality of first heaters, the first temperature zone corresponding with a lower portion of each of the sublimators by having the plurality of first heaters surrounding lower portions of the sidewall of the ampoule, and a second temperature zone having one or more second heaters, the second temperature zone corresponding with an upper portion of each of the sublimators by having the one or more second heaters disposed adjacent the opening, surrounding upper portions of the sidewall of the ampoule, and adjacent a top plate of the ampoule;
flowing the one or more vapor precursors through one or more delivery lines in fluid communication with a deposition chamber; wherein the one or more delivery lines are connected to one or more conduits at a junction between the deposition chamber and one or more sublimators; and
setting one or more valves in the one or more conduits to control a flow of precursor material from the one or more sublimators to the deposition chamber.

11. The method of claim 10, wherein setting one or more valves in an open position prevents the flow of process material into the deposition chamber, and wherein setting one or more valves in a closed position directs the flow of process material into the deposition chamber.

12. The method of claim 10, wherein the flowing the one or more vapor precursors through one or more delivery lines in fluid communication with a deposition chamber comprises maintaining a temperature of the one or more vapor precursors flowing through one or more delivery lines.

13. The method of claim 10, wherein the flowing the one or more vapor precursors through one or more delivery lines in fluid communication with a deposition chamber comprises maintaining a temperature of a first vapor precursor at a first temperature as the first vapor precursor flows through a first delivery line, and maintaining the temperature of a second vapor precursor at a second temperature as the second vapor precursor flows through a second delivery line.

14. A non-transitory computer readable medium having instructions stored thereon that, when executed, cause a method for controlling a flow of process material to a deposition chamber to be performed, the method as described in claim 10.

\* \* \* \* \*